(12) United States Patent
Tuttle

(10) Patent No.: US 6,806,527 B2
(45) Date of Patent: Oct. 19, 2004

(54) RECESSED MAGNETIC STORAGE ELEMENT AND METHOD OF FORMATION

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 10/315,053

(22) Filed: Dec. 10, 2002

(65) Prior Publication Data

US 2003/0117866 A1 Jun. 26, 2003

Related U.S. Application Data

(62) Division of application No. 09/877,105, filed on Jun. 11, 2001, now Pat. No. 6,551,852.

(51) Int. Cl.$^7$ .......................................... H01L 27/108
(52) U.S. Cl. ....................................................... 257/296
(58) Field of Search ................................. 257/296–310

(56) References Cited

U.S. PATENT DOCUMENTS

| 5,841,692 A | 11/1998 | Gallagher et al. |
| 6,153,443 A | 11/2000 | Durlam et al. |
| 2002/0096775 A1 | 7/2002 | Ning |

*Primary Examiner*—Fetsum Abraham
(74) *Attorney, Agent, or Firm*—Dickstein Shapiro Morin & Oshinsky LLP

(57) ABSTRACT

A method of forming self-aligned recessed MRAM structures is disclosed. Recessed pinned and sense magnetic layers of an MRAM stack are formed in recessed digit lines formed in an insulating layer.

30 Claims, 15 Drawing Sheets

US 6,806,527 B2

RECESSED MAGNETIC STORAGE ELEMENT AND METHOD OF FORMATION

CROSS REFERENCE TO RELATED APPLICATIONS

The present application is a divisional application of U.S. patent application Ser. No. 09/877,105 filed on Jun. 11, 2001, now U.S. Pat. No. 6,551,852, the disclosure of which is herewith incorporated by reference in its entirety.

FIELD OF THE INVENTION

The present invention relates to MRAM semiconductor structures and, in particular, to a method of forming recessed MRAM cells.

BACKGROUND OF THE INVENTION

Magnetic random access memories (MRAMs) employ magnetic multilayer films as storage elements. When in use, an MRAM cell stores information as digital bits, which in turn depend on the alternative states of magnetization of thin magnetic multilayer films forming each memory cell. As such, the MRAM cell has two stable magnetic configurations, a high resistance state representing a logic state 0 (or 1) and a low resistance state representing a logic state 1 (or 0).

A typical multilayer-film MRAM includes a number of bit or digit lines intersected by a number of word lines. At each intersection, at least one film of a magnetically coercive material is interposed between the corresponding bit line and digit line. Thus, this magnetic material and the films from the bit and digit lines form a magnetic memory cell which stores a bit of information.

The basic memory element of an MRAM is a patterned structure of a multilayer material, which is typically composed of a stack of different materials, such as copper (Cu), tantalum (Ta), permalloy (NiFe) or aluminum oxide ($Al_2O_3$), among others. The stack may contain as many as fourteen different overlapping material layers. Fabrication of such stacks requires deposition of the thin magnetic materials layer by layer, according to a predefined order.

FIG. 1 illustrates an exemplary MRAM structure including MRAM stacks 22 which have three respective associated bit or digit lines 18. The digit lines 18, typically formed of copper (Cu), are first formed in an insulating layer 16 formed over an underlayer 14 containing fabricated integrated circuits formed over substrate 10. Underlayer 14 may include, for example, portions of integrated circuitry, such as CMOS circuitry. First magnetic layers (pinned layers) 20, typically formed of a ferromagnetic materials, are provided over the digit lines 18. A pinned layer is called "pinned" because its magnetization direction requires a very high magnetic field to switch magnetization direction. Second magnetic layers (sense layers) 21 are free to switch magnetization direction with a much lower magnetic field. This way, information is stored in the magnetic layers of the memory cell as directions of the magnetization vectors which affect the resistance of the cell.

High density patterning, alignment and small cell size are very difficult to form in arrays of submicron MRAM devices. Improved fabrication techniques to form smaller and denser magnetic memory cells are desirable as they would allow the number of memory cells supported by a single CMOS supporting circuit to be greatly increased. It is also desirable to reduce the cost and complexity of fabricating magnetic memory cells and to reduce the number of patterning steps required in the fabrication of the memory cell while reducing fabrication errors.

SUMMARY OF THE INVENTION

The present invention provides a method for forming reduced area MRAM structures, such as pinned layers and underlying digit lines and sense layers, formed over various underlayers of an integrated circuit structure. According to the present invention, recessed MRAM structures, such as recessed pinned and sense magnetic layers of an MRAM stack, are formed over recessed digit lines, such as recessed copper lines, formed in an insulating layer.

These and other features and advantages of the invention will be more apparent from the following detailed description which is provided in connection with the accompanying drawings, which illustrate exemplary embodiments of the invention.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has a semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "metal" is intended to include not only elemental metal, but metal with other trace metals or in various alloyed combinations with other metals as known in the semiconductor art, as long as such alloy retains the physical and chemical properties of the metal. The term "metal" is also intended to include conductive oxides of such metals.

Figure 1:
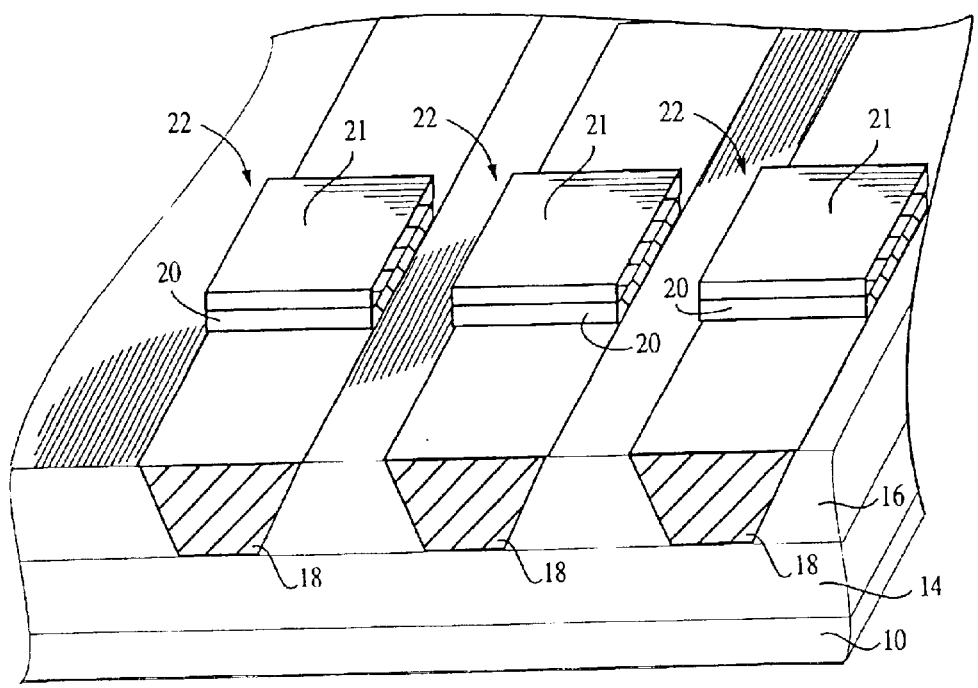
FIG. 1 is a schematic three-dimensional view of a portion of a conventional MRAM structure.
Figure 2:
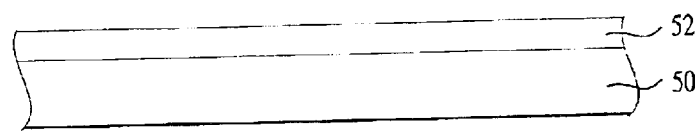
FIG. 2 illustrates a cross-sectional view of a semiconductor topography, at an intermediate stage of the processing, wherein a recessed MRAM structure will be constructed in accordance with the present invention.

The present invention provides a method for fabricating self-aligned recessed MRAM structures over a substrate containing portions of integrated circuitry, such as CMOS circuitry. Referring now to the drawings, where like elements are designated by like reference numerals, FIGS. 2–30 illustrate exemplary embodiments of methods of forming self-aligned recessed MRAM structures. FIG. 2 depicts a portion of a semiconductor substrate 50 on which underlayer 52 has been already formed according to well-known methods of the prior art. The underlayer 52 could include, for example, one or more circuit layers formed of conventional CMOS devices with respective completed vias making contact and/or electrical connections to the self-aligned recessed MRAM structures that will be subsequently formed according to the present invention.

Figure 3:
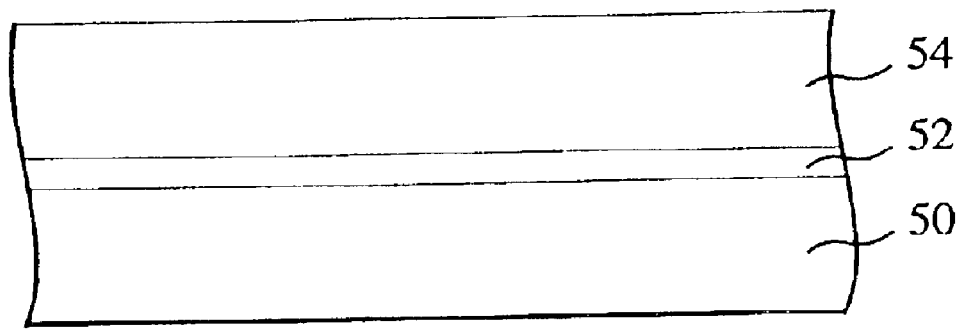
FIG. 3 illustrates a cross-sectional view of the recessed MRAM structure of the present invention at a stage of processing subsequent to that shown in FIG. 2.

Referring now to FIG. 3, an insulating layer 54 is formed overlying the substrate 50 and the underlying layer 52. In an exemplary embodiment of the invention, the insulating layer 54 is blanket deposited by spin coating to a thickness of about 500 Angstroms to about 10,000 Angstroms. However, other known deposition methods, such as chemical vapor deposition (CVD), plasma enhanced CVD (PECVD), or physical vapor deposition (PVD), may be used also in accordance with the characteristics of the IC device already formed. The insulating layer 54 may be formed of a conventional insulator, for example, a thermal oxide of silicon such as $SiO_2$, or a nitride such as $Si_3N_4$. Alternatively, a high temperature polymer, such as a polyimide, or a low dielectric constant inorganic material may be employed also.

Figure 4:
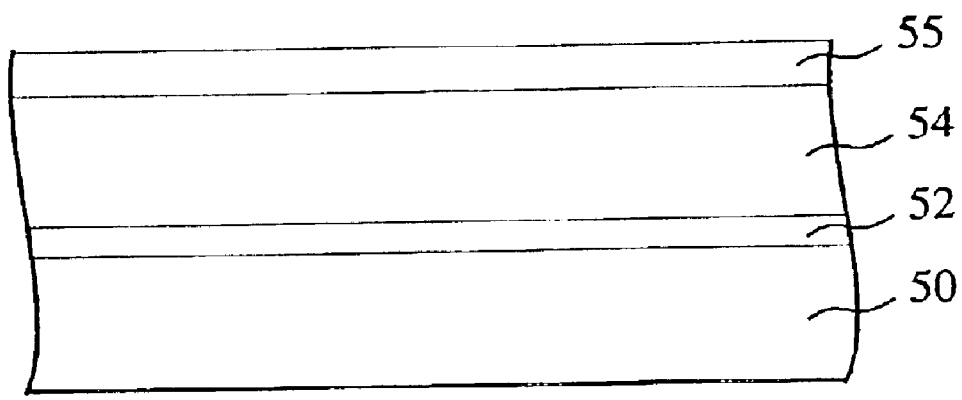
FIG. 4 illustrates a cross-sectional view of the recessed MRAM structure of the present invention at a stage of processing subsequent to that shown in FIG. 3.

Next, as illustrated in FIG. 4, a photoresist layer 55 is formed over the insulating layer 54. The photoresist layer 55 is exposed through a mask 56 (FIG. 5) with high-intensity UV light. The mask 56 may include any suitable pattern of opaque and clear regions that may depend, for example, on the desired pattern to be formed in the insulating layer 54. This way, portions 55a of the photoresist layer 55 are exposed through portions 56a of the mask 56 wherever portions of the insulating layer 54 need to be removed.

Figure 5:
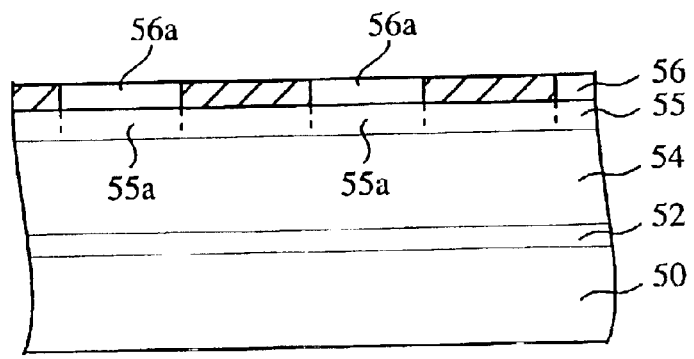
FIG. 5 illustrates a cross-sectional view of the recessed MRAM structure of the present invention at a stage of processing subsequent to that shown in FIG. 4.
Figure 6:
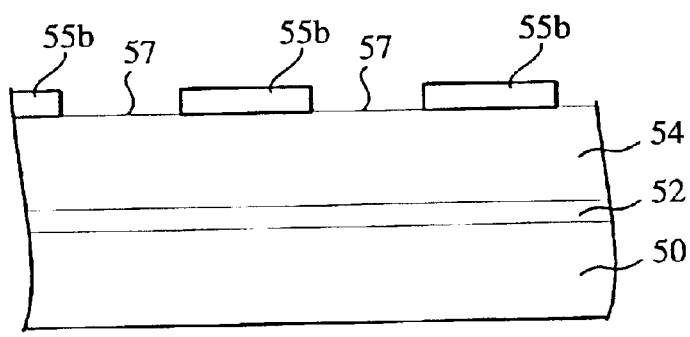
FIG. 6 illustrates a cross-sectional view of the recessed MRAM structure of the present invention at a stage of processing subsequent to that shown in FIG. 5.

Although FIG. 5 schematically illustrates mask 56 positioned over the photoresist layer 55, those skilled in the art will appreciate that mask 56 is typically spaced from the photoresist layer 55 and light passing through mask 56 is focussed onto the photoresist layer 55. After exposure and development of the exposed portions 55a, portions 55b of the unexposed and undeveloped photoresist are left over the insulating layer 54, as shown in FIG. 6. This way, openings 57 (FIG. 6) are formed in the photoresist layer 55.

Figure 7:
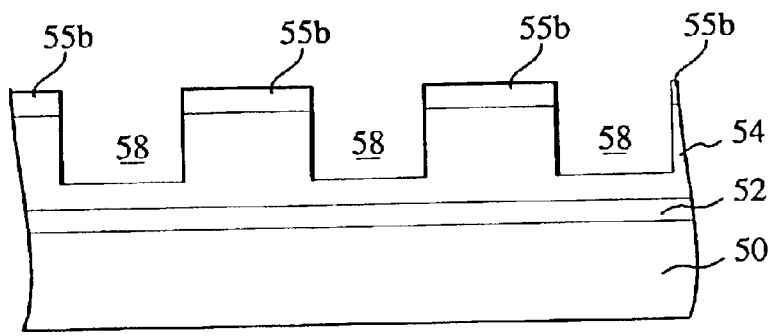
FIG. 7 illustrates a cross-sectional view of the recessed MRAM structure of the present invention at a stage of processing subsequent to that shown in FIG. 6.
Figure 8:
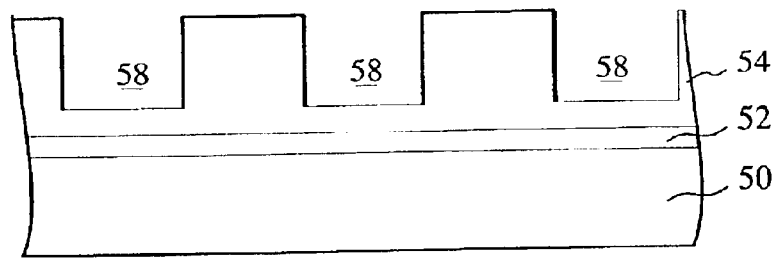
FIG. 8 illustrates a cross-sectional view of the recessed MRAM structure of the present invention at a stage of processing subsequent to that shown in FIG. 7.

An etch step is next performed to obtain grooves 58 in the insulating layer 54, as illustrated in FIGS. 7–8. The grooves 58 are etched to a depth of about 500 Angstroms to about 5,000 Angstroms, more preferably of about 2,000 Angstroms. Subsequent to the formation of the grooves 58, the remaining portions 55b of the positive photoresist layer 55 are then removed by chemicals such as hot acetone, or by dry plasma processes commonly known in the art.

Figure 9:
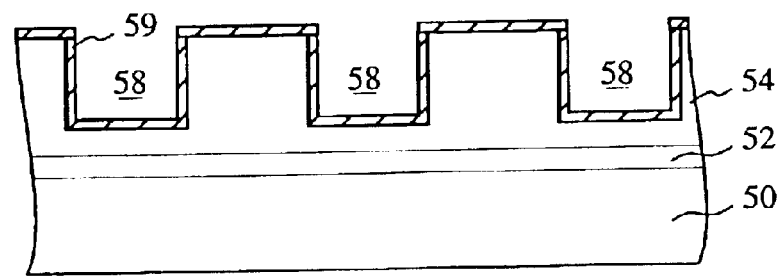
FIG. 9 illustrates a cross-sectional view of the recessed MRAM structure of the present invention at a stage of processing subsequent to that shown in FIG. 8.

Subsequent to the formation of the grooves 58 (FIGS. 7–8), a thin barrier layer 59 is formed in the grooves 58 and over the insulating layer 54, as shown in FIG. 9. The barrier layer 59 may comprise bonding materials such as tantalum (Ta), titanium (Ti), titanium-tungsten (TiW), titanium nitride (TiN) or chromium (Cr), among others. The barrier layer 59 forms a strong mechanical and chemical bond between the conductive material which will be formed later and the insulating layer 54 to help prevent peeling of the formed conductive layer from the insulating layer. In a preferred embodiment of the invention, the barrier layer 59 is formed of sputtered tantalum. In this embodiment, tantalum is deposited to a thickness of about 50 Angstroms to about 200 Angstroms.

Figure 10:
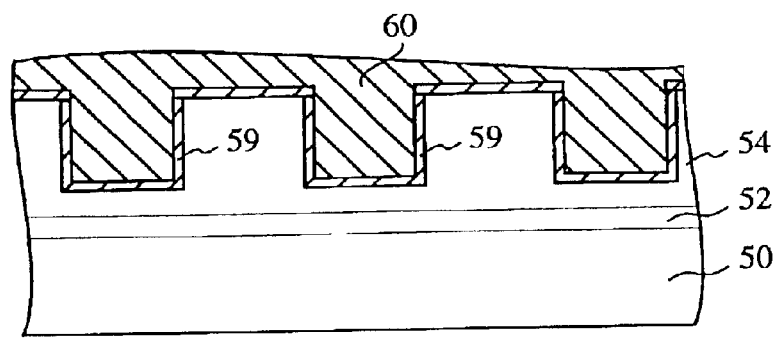
FIG. 10 illustrates a cross-sectional view of the recessed MRAM structure of the present invention at a stage of processing subsequent to that shown in FIG. 9.

Next, as illustrated in FIG. 10, a conductive material layer 60 is formed over the barrier layer 59 to fill in the grooves 58. In a preferred embodiment, the conductive material comprises copper (Cu). However, other conductive materials such as aluminum, tungsten or gold, among others, may be used also. Further, metal alloys may be employed also, depending on desired characteristics of the IC device.

Figure 11:
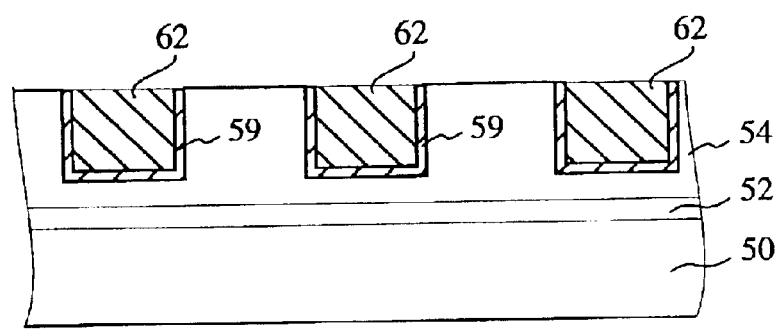
FIG. 11 illustrates a cross-sectional view of the recessed MRAM structure of the present invention at a stage of processing subsequent to that shown in FIG. 10.
Figure 12:
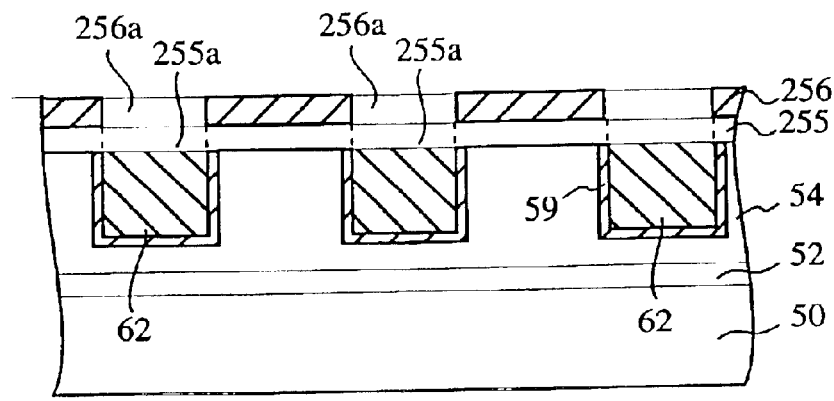
FIG. 12 illustrates a cross-sectional view of the recessed MRAM structure of the present invention at a stage of processing subsequent to that shown in FIG. 11.

The conductive material layer 60 is formed over the barrier layer 59 by deposition, for example, and then excess material is removed to form metal lines 62 (FIG. 11). In an exemplary embodiment of the present invention, the excess conductive material layer 60 and the barrier layer material from the top portions of the insulating layer 54 are removed by means of chemical mechanical polishing (CMP) or a well-known RIE dry etching process. Either way, the top surfaces of the barrier layer 59 and the metal lines 62 are substantially flat and uniform across the entire surface of the substrate, as shown in FIG. 11. Each metal line 62 will form the bit or digit line of a conventional MRAM structure.

Figure 13:
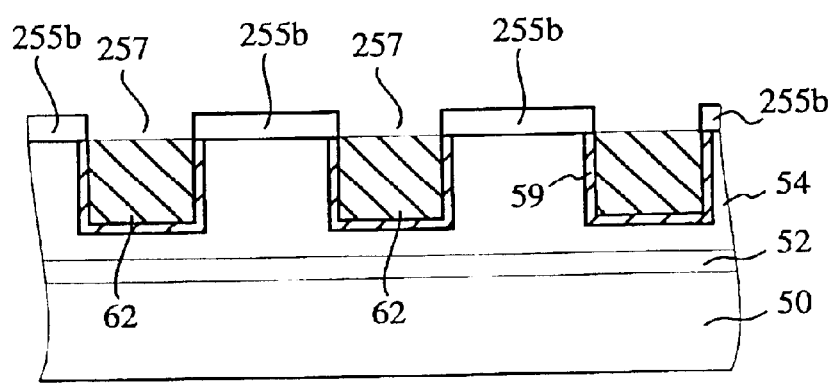
FIG. 13 illustrates a cross-sectional view of the recessed MRAM structure of the present invention at a stage of processing subsequent to that shown in FIG. 12.
Figure 14:
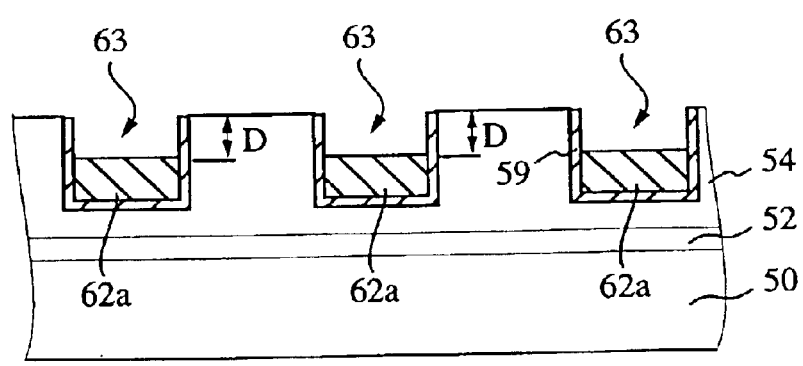
FIG. 14 illustrates a cross-sectional view of the recessed MRAM structure of the present invention at a stage of processing subsequent to that shown in FIG. 13.

After the CMP polishing process, portions of the metal lines 62 are recessed, by etching, for example, to form trenches (recessed regions) 63 in recessed metal lines 62a, as shown in FIGS. 12–16. For this, a photoresist layer 255 (FIG. 12) is formed over the insulating layer 54 and the metal lines 62. The photoresist layer 255 is exposed through a mask 256 (FIG. 12) with high-intensity UV light. The mask 256 may include any suitable pattern of opaque and clear regions that may depend, for example, on the desired pattern to be formed in the metal lines 62. This way, portions 255a (FIG. 12) of the photoresist layer 255 are exposed through portions 256a (FIG. 12) of the mask 256 wherever portions of the metal lines 62 need to be removed. After exposure and development of the exposed portions 255a, portions 255b of the unexposed and undeveloped photoresist are left over the insulating layer 54, as shown in FIG. 13. This way, openings 257 (FIG. 13) are formed in the photoresist layer 255. An etch step is next performed to form trenches (recessed regions) 63 in recessed metal lines 62a, as shown in FIG. 14.

Figure 15:
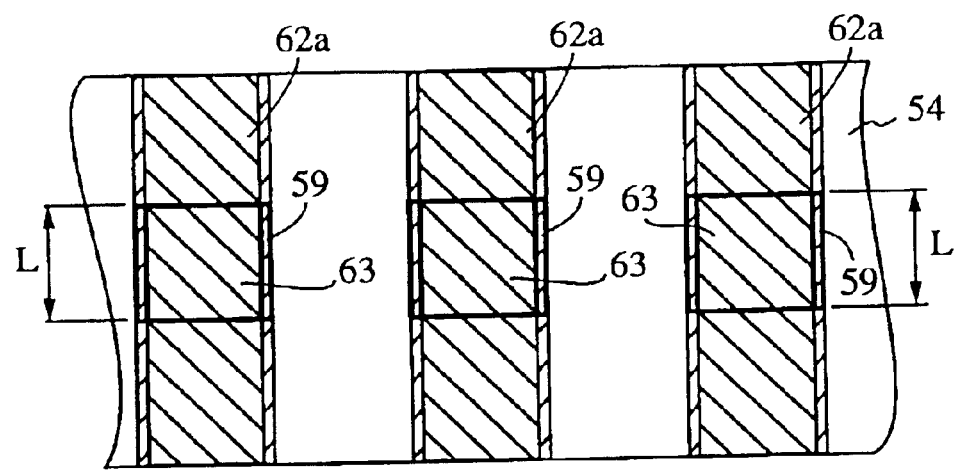
FIG. 15 is a top view of the recessed MRAM structure of FIG. 14.
Figure 16:
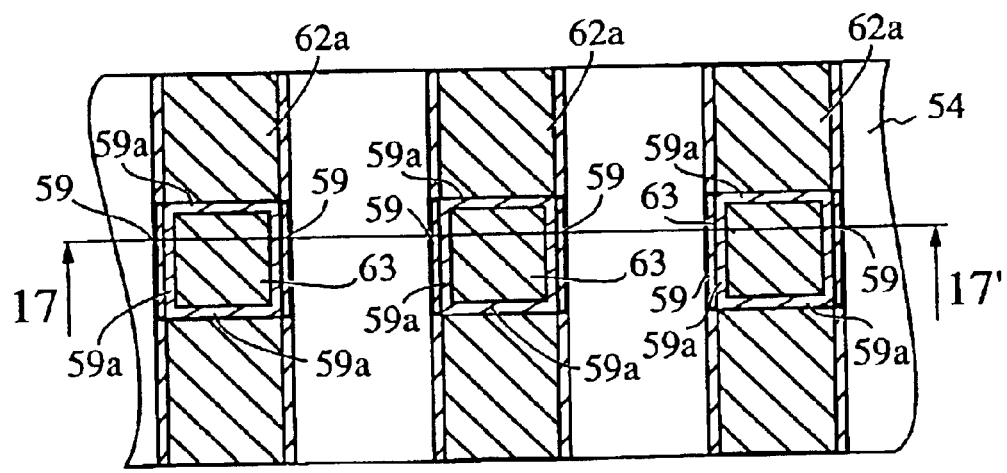
FIG. 16 is a top view of the recessed MRAM structure of FIG. 14 at a stage of processing subsequent to that shown in FIG. 15.

For a better understanding of the invention, FIG. 15 illustrates a top view of the substrate 50 including the three recessed metal lines 62 having trenches 63 etched therein. As illustrated in FIG. 14, the trenches 63 are etched in each metal line 62 to a depth D of about 200 Angstroms to about 1,000 Angstroms, more preferably of about 400 Angstroms. The depth of each trench 63 depends upon the thicknesses of the various material layers that will form the recessed MRAM structures 100 (FIGS. 22–29) in the trenches 63, the formation of which will be described in more detail below. As further illustrated in FIG. 15, the length L of each of the trenches 63 is of about 500 Angstroms to about 10,000 Angstroms, more preferably of about 2,000 Angstroms. Although FIGS. 14–16 illustrate trenches 63 as having a rectangular shape, the invention is not limited to this embodiment. Accordingly, trenches 63 may have any geometric shape, such as square or eliptical, for example.

As illustrated in FIG. 16, and because at the completion of the etching step the trenches 63 have only two out of four walls covered by the barrier layer 59, it is desirable that all four walls of each of the trenches 63 be protected by a barrier layer. In this case, a barrier layer 59a (FIG. 16) may be formed in the trenches 63 on all walls to obtain the structure of FIG. 16. The barrier layer 59a may also comprise bonding materials such as tantalum (Ta), titanium (Ti), titanium-tungsten (TiW), titanium nitride (TiN) or chromium (Cr), among others. In a preferred embodiment of the invention, the barrier layer 59a is formed of sputtered tantalum, which may be deposited, for example, to a thickness of about 50 Angstroms to about 200 Angstroms.

During the formation of the barrier layer 59a in the trenches 63 on the unprotected trench walls, the thickness of the barrier on the other two protected is increased; however, the increase in the thickness of these walls will not significantly affect the performance of the device. For simplicity and for a better understanding of the invention, FIG. 16 illustrates the barrier layer 59a as being formed only covering the walls of the trenches 63. However, it must be understood that the barrier layer 59a also covers the top surface of the insulating layer 54.

Subsequent to the formation of the barrier layer 59a on the walls of the trenches 63 (FIG. 16) and over the substrate 50, the processing steps for the completion of the recessed MRAM structures 100 having recessed magnetic multilayer films (FIGS. 22–29) are now carried out. For a better understanding of the invention, FIG. 17 is a partial cross-sectional view of the structure of FIG. 16 illustrating only the middle portion of the structure of FIG. 16 with only one recessed metal line 62a having trench 63 formed therein.

Figure 17:
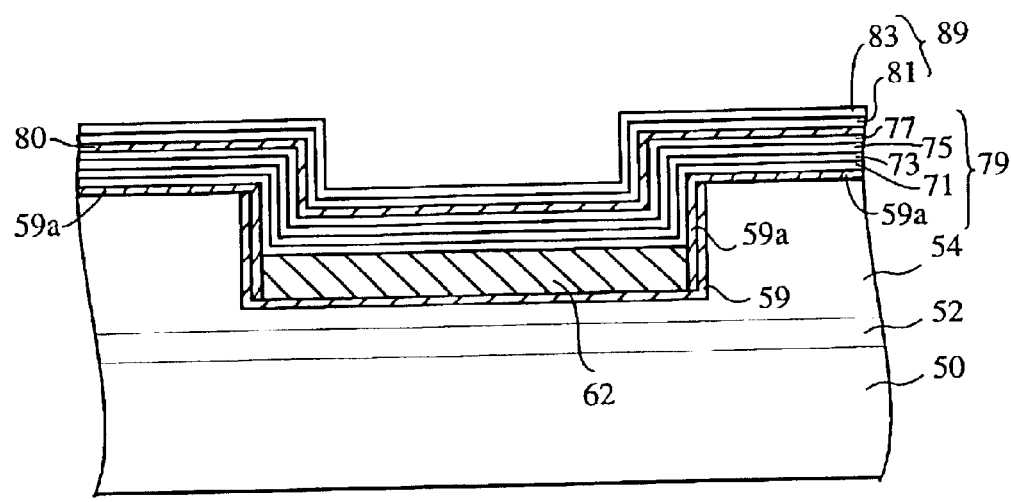
FIG. 17 illustrates a middle cross-sectional view of the recessed MRAM structure of FIG. 16, taken along line 17–17', at a stage of processing subsequent to that shown in FIG. 16.

As illustrated in FIG. 17, a plurality of films are successively deposited over the recessed metal line 62a and in the trenches 63 to form a first recessed magnetic member 79. In an exemplary-embodiment of the present invention and as illustrated in FIG. 17, a first tantalum (Ta) layer 71 (of about 20–400 Angstroms thick, more preferably of about 50 Angstroms thick), a first nickel-iron (NiFe) layer 73 (of about 10–100 Angstroms thick, more preferably of about 20 Angstroms thick), an iridium-manganese (IrMn) layer 75 (of about 50–300 Angstroms thick, more preferably of about 100 Angstroms thick) and a second nickel-iron (NiFe) layer 77 (of about 10–100 Angstroms thick, more preferably of about 40 Angstroms thick) are successively blanket deposited over the recessed metal line 62a and in the trench 63, to form the first self-aligned recessed magnetic member (pinned layer) 79. Deposition of the layers 71, 73, 75 and 77 may be accomplished by magnetron sputtering, for example. However, other conventional deposition methods may be used also, as desired.

Following the deposition of the layers 71, 73, 75 and 77, a nonmagnetic, electrically nonconductive recessed layer 80 formed of, for example, aluminum oxide ($Al_2O_3$) (of about 5–25 Angstroms thick, more preferably of about 15 Angstroms thick) is next formed overlying the first recessed magnetic member 79, as also shown in FIG. 17. Although aluminum oxide is the preferred material, it must be understood that the invention is not limited to its use, and other nonmagnetic materials, such as copper (Cu), titanium oxide (TiO$_2$), magnesium oxide (MgO), silicon oxide (SiO$_2$) or aluminum nitride (AlN), may be used also.

Figure 22:
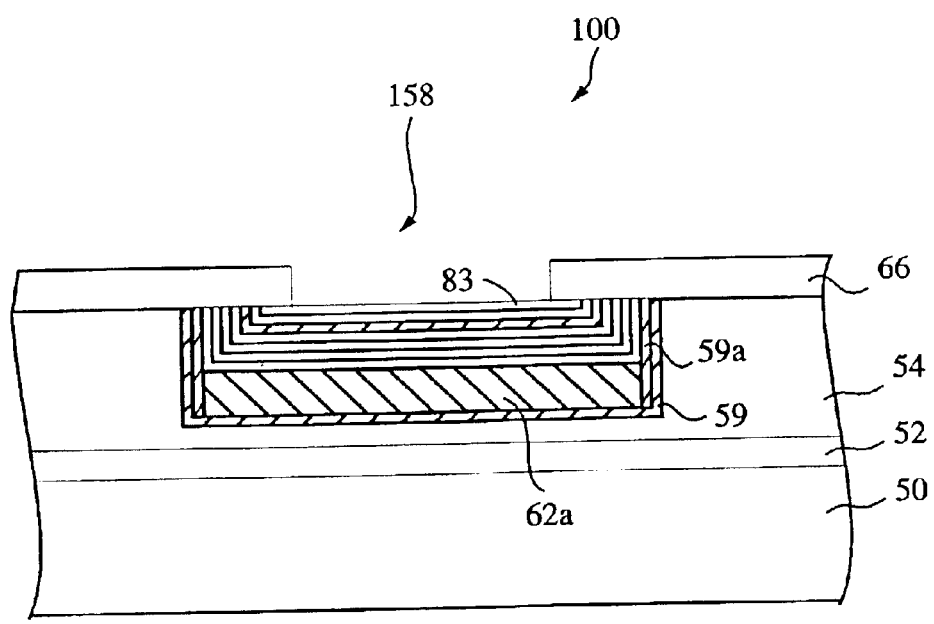
FIG. 22 illustrates a cross-sectional view of the recessed MRAM structure of the present invention at a stage of processing subsequent to that shown in FIG. 21.

A plurality of films forming a second recessed magnetic member 89 are next formed over the nonmagnetic recessed layer 80, as also shown in FIG. 17. Accordingly, in an exemplary embodiment of the present invention, a third nickel-iron (NiFe) layer 81 (of about 10–100 Angstroms thick, more preferably of about 40 Angstroms thick) and a second tantalum (Ta) layer 83 (of about 10–100 Angstroms thick, more preferably of about 50 Angstroms thick) are successively blanket deposited over the nonmagnetic recessed layer 80 and in the trenches 63, to form the second recessed magnetic member (sense layer) 89, as shown in FIG. 17. Deposition of the layers 81 and 83 may be accomplished by magnetron sputtering, for example, but other conventional deposition methods may be used also, depending on the characteristics of the IC devices constructed previously to the formation of the recessed MRAM structures 100 (FIG. 22).

Figure 18:
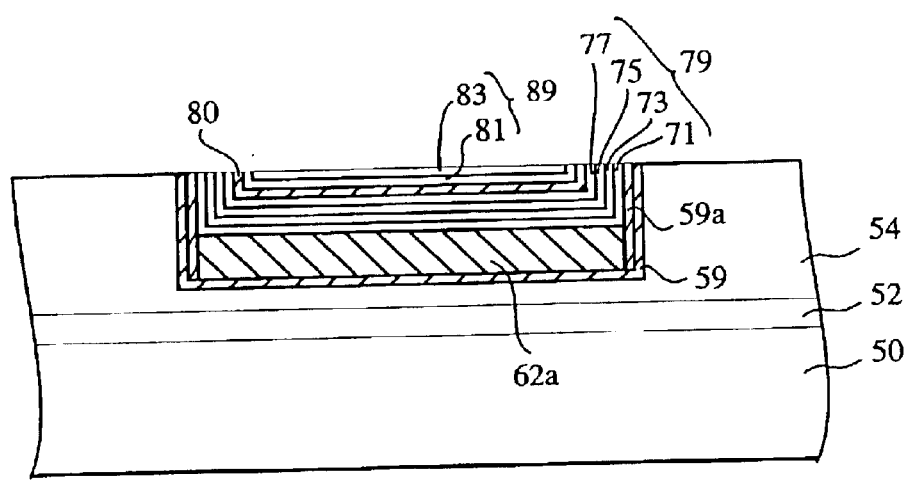
FIG. 18 illustrates a cross-sectional view of the recessed MRAM structure of the present invention at a stage of processing subsequent to that shown in FIG. 17.

The second tantalum (Ta) layer 83 is formed over the third nickel-iron (NiFe) layer 81 to fill in the trenches 63 and all deposited layers are etched back and the surface of layer 54 is planarized by CMP to form the structure of FIG. 18. The top surface of all deposited layers within the recess is substantially flat and uniform across the entire surface of the recess, as shown in FIG. 18.

Figure 19:
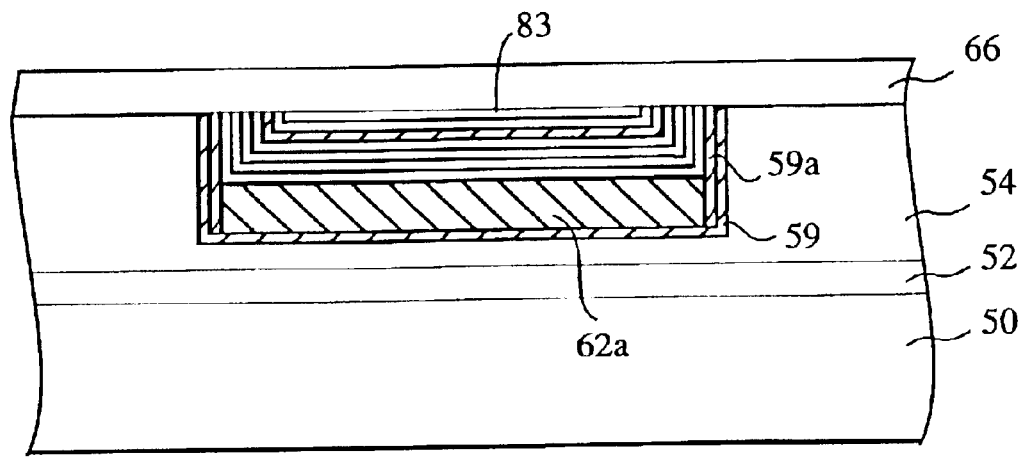
FIG. 19 illustrates a cross-sectional view of the recessed MRAM structure of the present invention at a stage of processing subsequent to that shown in FIG. 18.

After the formation of the structure of FIG. 18, a dielectric layer 66 is formed over the whole surface of the substrate 50, including the second tantalum (Ta) layer 83 and exposed portions of the layers 71, 73, 75, 77, 80 and 81, as illustrated in FIG. 19. The dielectric layer 66 electrically isolates the exposed portions of the layers 71, 73, 75, 77, 80 and 81 and completes the formation of the self-aligned recessed MRAM structure 100 (FIG. 22). In an exemplary embodiment of the invention, the dielectric layer 66 is blanket deposited by spin coating to a thickness of about 500 Angstroms to about 10,000 Angstroms. However, other known deposition methods, such as chemical vapor deposition (CVD), plasma enhanced CVD (PECVD), or physical vapor deposition (PVD), may be used also in accordance with the characteristics of the IC device already formed. The dielectric layer 66 may be formed of a conventional insulator, for example, aluminum oxide (Al$_2$O$_3$), a thermal oxide of silicon such as SiO$_2$, or a nitride such as Si$_3$N$_4$. Alternatively, a high temperature polymer, such as a polyimide, or a low dielectric constant inorganic material may be employed also.

Figure 20:
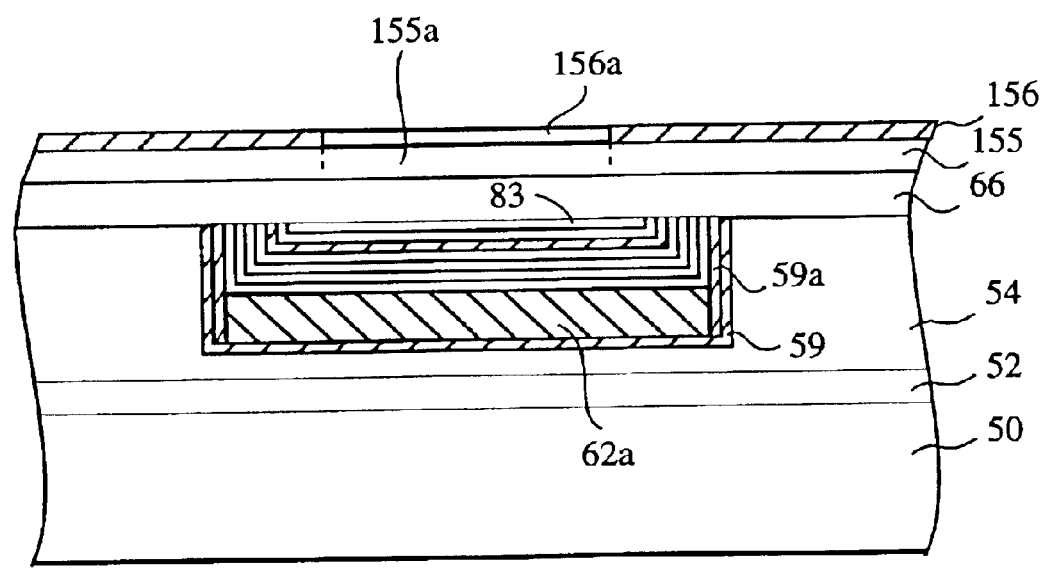
FIG. 20 illustrates a cross-sectional view of the recessed MRAM structure of the present invention at a stage of processing subsequent to that shown in FIG. 19.

Next, as illustrated in FIG. 20, a photoresist layer 155 is formed over the dielectric layer 66. The photoresist layer 155 is exposed through a mask 156 (FIG. 20) with high-intensity UV light. The mask 156 may include any suitable pattern of opaque and clear regions that may depend, for example, on the desired pattern to be formed in the dielectric layer 66. This way, portions 155a of the photoresist layer 55 are exposed through portions 156a of the mask 156 wherever portions of the dielectric layer 66 need to be removed.

Figure 21:
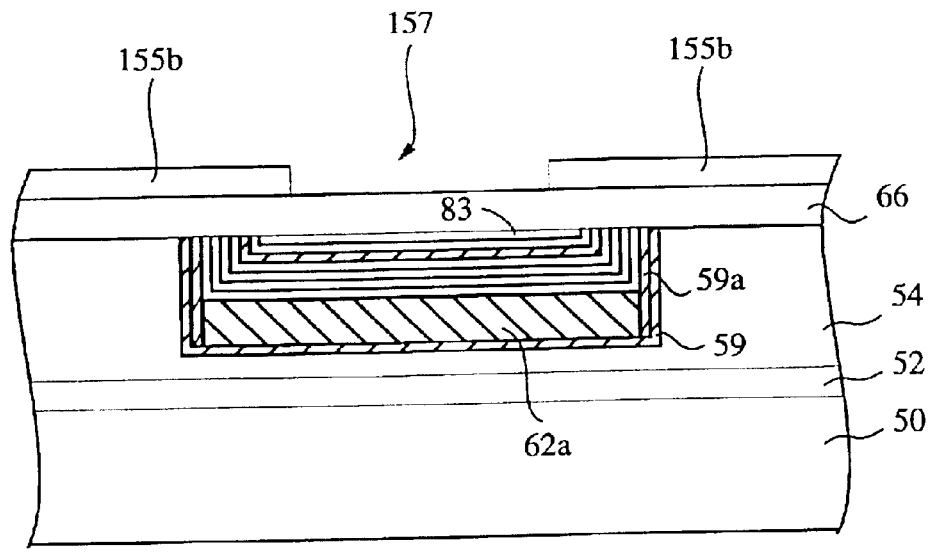
FIG. 21 illustrates a cross-sectional view of the recessed MRAM structure of the present invention at a stage of processing subsequent to that shown in FIG. 20.

After exposure and development of the exposed portions 155a, portions 155b of the unexposed and undeveloped photoresist are left over the dielectric layer 66, as shown in FIG. 21. This way, opening 157 (FIG. 21) is formed in the photoresist layer 155.

Figure 23:
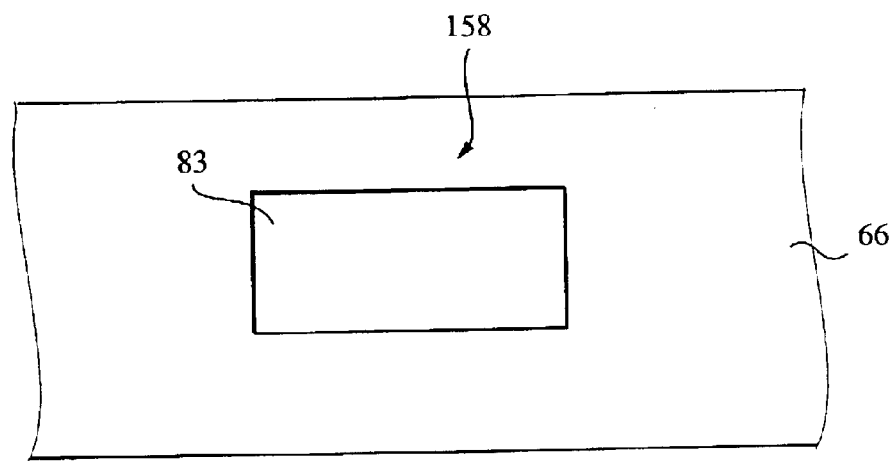
FIG. 23 is a top view of the recessed MRAM structure of FIG. 22.

An etch step is next performed to obtain opening 158 in the dielectric layer 66, as illustrated in FIG. 22, and to complete the formation of the self-aligned recessed MRAM structure 100. For a better understanding of the invention, FIG. 23 illustrates a top view of the structure of FIG. 22. As shown in FIGS. 22–23, the opening 158 is etched in the dielectric layer 66 to expose portions of the second tantalum (Ta) layer 83 formed previously in the trench 63, as explained above with reference to FIG. 18. Subsequent to the formation of the opening 158, the remaining portions 155b (FIG. 21) of the positive photoresist layer 155 are removed by chemicals, such as hot acetone or by dry plasma processes commonly known in the art, to obtain the recessed self-aligned MRAM structure of FIGS. 22–23.

Figure 24:
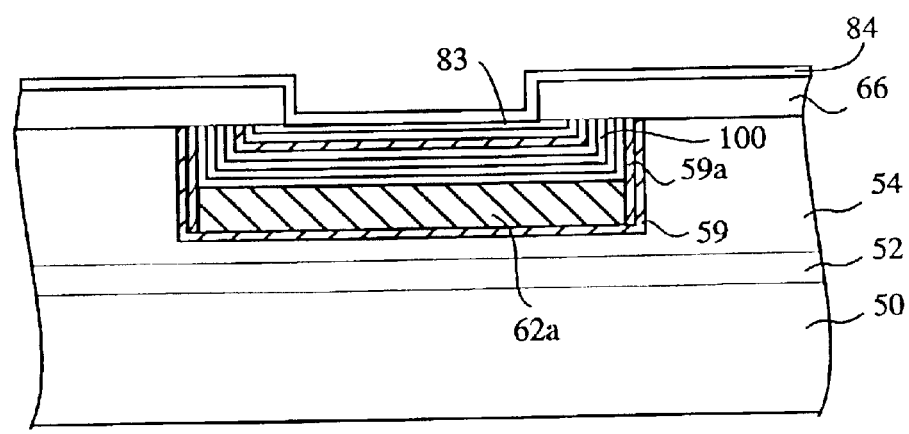
FIG. 24 illustrates a cross-sectional view of the recessed MRAM structure of the present invention at a stage of processing subsequent to that shown in FIG. 22 and in accordance with a first embodiment.

Subsequent to the exposure of the second tantalum (Ta) layer 83, additional steps to create a functional recessed MRAM cell may be carried out. Thus, additional insulating layers and conductive plugs from the recessed self-aligned MRAM structure 100 (FIG. 22) to word line conductors, to enable bidirectional current flow in the presence of a read and write signal, may be formed to complete the fabrication process of such MRAM cells. As such, a barrier layer 84 is formed over exposed portion of the second tantalum (Ta) layer 83 and over the dielectric layer 66, as illustrated in FIG. 24. The barrier layer 84 may comprise bonding materials such as tantalum (Ta), titanium (Ti), titanium-tungsten (TiW), titanium nitride (TiN) or chromium (Cr), among others. In a preferred embodiment of the invention, the barrier layer 84 is formed of sputtered tantalum, which may be deposited, for example, to a thickness of about 50 Angstroms.

Figure 25:
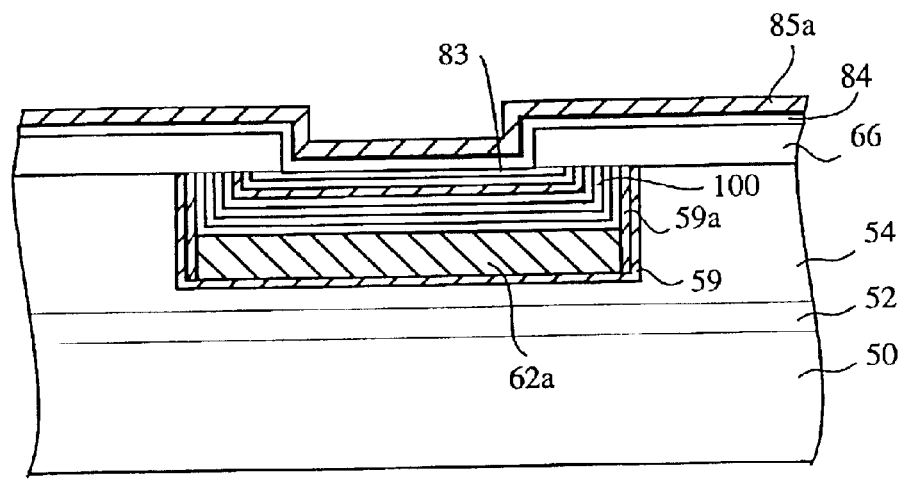
FIG. 25 illustrates a cross-sectional view of the recessed MRAM structure of the present invention at a stage of processing subsequent to that shown in FIG. 24.
Figure 26:
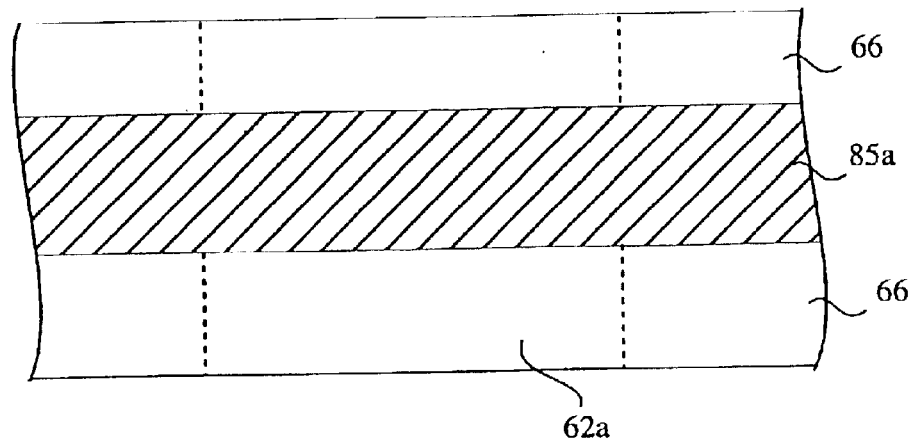
FIG. 26 is a top view of the recessed MRAM structure of FIG. 25.

Referring now to FIGS. 25–26, a conductive layer (word line) 85a, is formed over the barrier layer 84 in a direction orthogonal to that of the recessed metal line 62a including the recessed self-aligned MRAM structures 100. In an exemplary embodiment of the present invention, the conductive layer (word line) 85a is formed of copper to a thickness of 1,000 Angstroms to about 5,000 Angstroms, more preferably of about 2,000 Angstroms. However, the invention is not limited to this exemplary embodiment, and other conductive materials, for example metals such as tungsten (W), gold (Au) or platinum (Pt), among others, may be used also, as desired.

According to an exemplary embodiment of the invention, a conductive layer (word line) 85a (FIGS. 25–26) is formed by a deposition process (FIG. 25) followed by patterning, as shown in the top view of FIG. 26 in a direction orthogonal to that of the recessed metal line 62a. Patterning may be accomplished by using a reactive plasma etch, performed, for example, in electron cyclotron resonance (ECR) or other high density plasmas, such as an inductively coupled plasma system, or a helicon plasma system.

Figure 27:
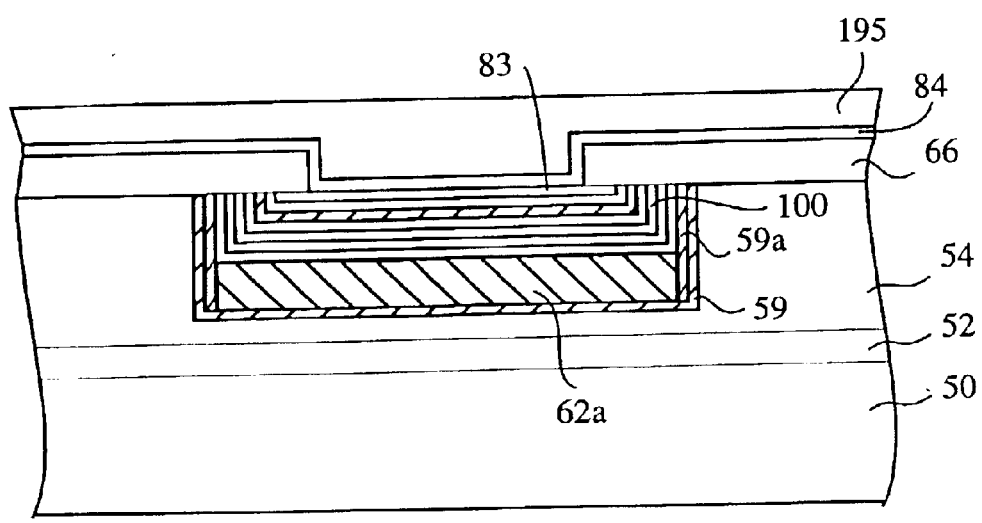
FIG. 27 illustrates a cross-sectional view of the recessed MRAM structure of the present invention at a stage of processing subsequent to that shown in FIG. 24 and in accordance with a second embodiment.
Figure 28:
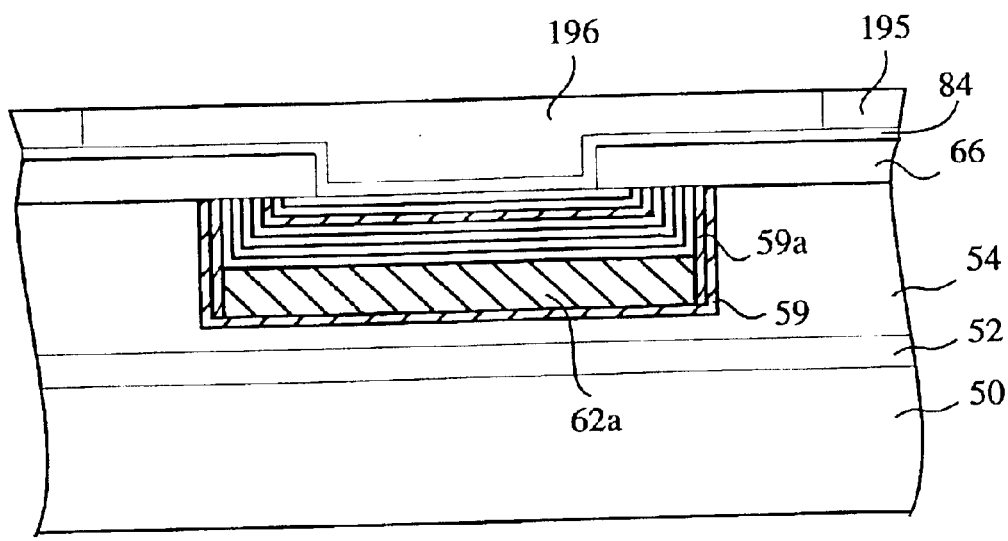
FIG. 28 illustrates a cross-sectional view of the recessed MRAM structure of the present invention at a stage of processing subsequent to that shown in FIG. 27.

According to another exemplary embodiment of the invention, a conductive layer (word line) 85b (FIGS. 29–30) is formed by a damascene process in a direction orthogonal to that of the recessed metal line 62a including the recessed self-aligned MRAM structures 100. For this embodiment, reference is now made to FIG. 27 which illustrates the structure of FIG. 24 at a subsequent stage of processing. As shown in FIG. 27, a dielectric layer 195 is formed over the barrier layer 84 and then is etched in a direction orthogonal to that of the recessed metal lines 62a to form a trench 196 (FIG. 28). The trench 196 is then filled with a conductive material, for example copper, which is then chemically mechanically polished to complete the formation of the conductive layer (word line) 85b (FIGS. 29–30) and of a self-aligned recessed MRAM cell 200, illustrated in FIG. 29.

Figure 29:
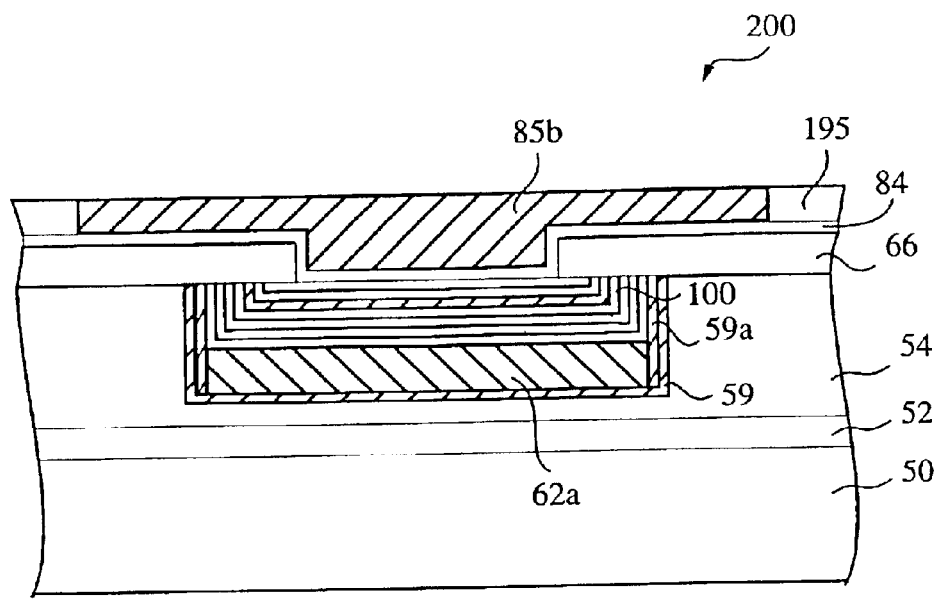
FIG. 29 illustrates a cross-sectional view of the recessed MRAM structure of the present invention at a stage of processing subsequent to that shown in FIG. 28.
Figure 30:
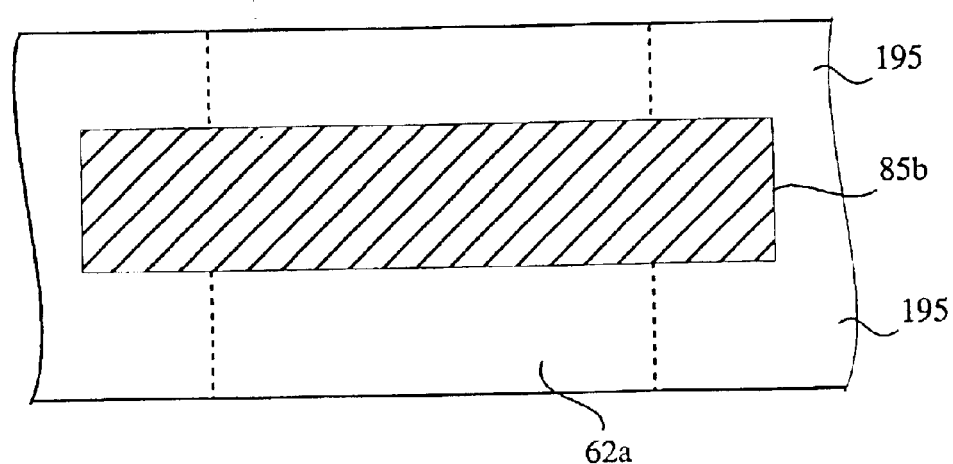
FIG. 30 is a top view of the recessed MRAM structure of FIG. 29.

Although FIGS. 25, 29 illustrate self-aligned recessed MRAM structures 100 in direct contact with the conductive layers (word lines) 85a, 85b, it must be understood that the invention is not limited to this embodiment, and other interceding structures, such as conductive plugs and/or metal lines from the recessed MRAM structures 100 to the conductive layers (word lines) 85*a*, 85*b* may be formed also, as desired.

Figure 31:
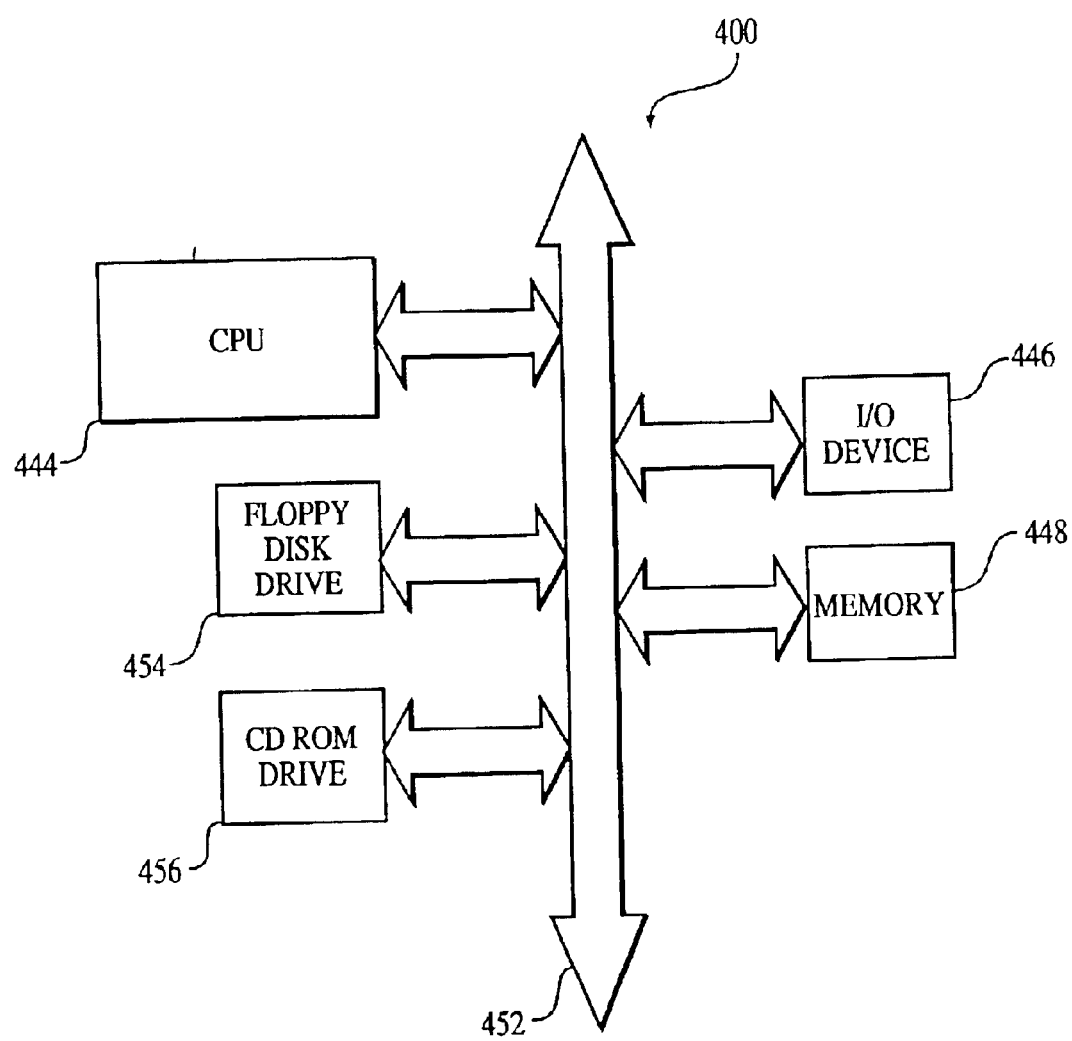
FIG. 31 is a schematic diagram of a processor system incorporating an MRAM structure of the present invention.

A typical processor based system 400 which includes a memory circuit 448, for example an MRAM with self-aligned recessed MRAM structures 100 (FIGS. 22–30) constructed according to the present invention is illustrated in FIG. 31. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 may be combined with the processor, i.e. CPU 444, in a single integrated circuit.

Although the exemplary embodiments described above illustrate the formation of one recessed self-aligned MRAM cell 200 having respective recessed self-aligned MRAM structures 100 (FIG. 22) it is to be understood that the present invention contemplates the use of a plurality of self-aligned recessed MRAM structures 100 of pinned layers and sense layers as part of a plurality of MRAM cells arranged, for example, in rows and columns in a memory cell array. In addition, although the exemplary embodiments described above refer to a specific topography of the MRAM structures with specific magnetic materials forming such structures, it must be understood that the invention is not limited to the above-mentioned magnetic materials, and other magnetic and ferromagnetic materials, such as cobalt-iron or iron, among others, may be used also.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A magnetic random access memory structure comprising:
   a plurality of first recessed conductors formed in an insulating layer;
   a plurality of recessed first and second magnetic members formed over said plurality of first recessed conductors, said plurality of first and second magnetic members overlapping and being recessed in said insulating layer; and
   a plurality of second conductors provided over said first and second magnetic members and arranged at an angle relative to said plurality of first recessed conductors.

2. The magnetic random access memory structure of claim 1 further comprising a nonmagnetic layer between said plurality of recessed first magnetic members and said plurality of recessed second magnetic members.

3. The magnetic random access memory structure of claim 2, wherein said nonmagnetic layer comprises a conductive material or an insulator.

4. The magnetic random access memory structure of claim 1, wherein each of said plurality of recessed first magnetic members contacts a respective one of said plurality of first recessed conductors.

5. The magnetic random access memory structure of claim 4, wherein said respective one of said plurality of first recessed conductors includes a material selected from the group consisting of metals and metal alloys.

6. The magnetic random access memory structure of claim 1, wherein each of said plurality of recessed first magnetic members includes a recessed layer of ferromagnetic material.

7. The magnetic random access memory structure of claim 6, wherein said ferromagnetic material is selected from the group consisting of nickel-iron, nickel, cobalt-nickel-iron, and iron.

8. The magnetic random access memory structure of claim 1, wherein each of said plurality of recessed second magnetic members includes a recessed layer of ferromagnetic material.

9. The magnetic random access memory structure of claim 8, wherein said ferromagnetic material is selected from the group consisting of nickel-iron, nickel, cobalt-nickel-iron, and iron.

10. The magnetic random access memory structure of claim 1, wherein said plurality of first recessed conductors form a plurality of digit lines and said plurality of second conductors form a plurality of word lines.

11. A memory device comprising a plurality of self-aligned magnetic random access memory cells, said self-aligned magnetic random access memory cells comprising a plurality of recessed pinned layers formed in recesses of an insulating layer formed over a semiconductor substrate, and a plurality of recessed sense layers formed in said recesses and over said plurality of recessed pinned layers.

12. The memory device of claim 11 further comprising a nonmagnetic layer between said plurality of recessed pinned layers and said plurality of recessed sense layers.

13. The memory device of claim 12, wherein said nonmagnetic layer comprises a conductive material or an insulator.

14. The memory device of claim 11, wherein each of said plurality of recessed pinned layers contacts a respective underlying conductive line.

15. The memory device of claim 14, wherein said underlying conductive line is formed of a conductive material selected from the group consisting of metals and metal alloys.

16. The memory device of claim 11, wherein each of said plurality of recessed pinned layers includes a recessed layer of ferromagnetic material.

17. The memory device of claim 16, wherein said ferromagnetic material is selected from the group consisting of nickel-iron, nickel, cobalt-nickel-iron, and iron.

18. The memory device of claim 11, wherein each of said plurality of recessed sense layers includes a recessed layer of ferromagnetic material.

19. The memory device of claim 18, wherein said ferromagnetic material is selected from the group consisting of nickel-iron, nickel, cobalt-nickel-iron, and iron.

20. The memory device of claim 11 further comprising a plurality of word lines formed in a direction orthogonal to said plurality of recessed pinned layers and said recessed sense layers.

21. A processor-based system, comprising:
   a processor; and
   an integrated circuit coupled to said processor, said integrated circuit comprising a plurality of first conductors orthogonal to a plurality of second conductors, and a plurality of recessed second magnetic members formed over a plurality of recessed first magnetic members, said plurality of recessed second magnetic members and recessed first magnetic members being located between an area where said plurality of first conductors and said plurality of second conductors overlap.

22. The processor-based system of claim 21, further comprising a nonmagnetic layer between said plurality of recessed first magnetic members and said plurality of recessed second magnetic members.

23. The processor-based system of claim 22, wherein said nonmagnetic layer comprises a conductive material or an insulator.

24. The processor-based system of claim 21, wherein each of said plurality of recessed first magnetic members contacts a respective one of said plurality of first conductors.

25. The processor-based system of claim 24, wherein each of said plurality of recessed first magnetic members includes a recessed layer of ferromagnetic material.

26. The processor-based system of claim 21, wherein each of said plurality of recessed second magnetic members includes a recessed layer of ferromagnetic material.

27. The processor-based system of claim 21, wherein said plurality of first conductors forms a plurality of digit lines and said plurality of second conductors forms a plurality of word lines.

28. The processor-based system of claim 21, wherein said integrated circuit is part of said recessed self-aligned magnetic random access memory cells.

29. The processor-based system of claim 21, wherein said processor and said integrated circuit are integrated on same chip.

30. The processor-based system of claim 21, wherein said integrated circuit is formed in a semiconductor substrate.

* * * * *